(12) United States Patent
Yang et al.

(10) Patent No.: US 6,227,211 B1
(45) Date of Patent: May 8, 2001

(54) UNIFORMITY IMPROVEMENT OF HIGH ASPECT RATIO CONTACT BY STOP LAYER

(75) Inventors: Bao Ru Yang, I-Lan; Wen-Chuan Chiang; James Jann-Ming Wu, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/206,740

(22) Filed: Dec. 7, 1998

(51) Int. Cl.$^7$ .............................. H01L 21/302; B08B 6/00
(52) U.S. Cl. .......................... 134/1.1; 134/1.2; 438/695; 438/696; 438/723; 438/724; 438/734; 438/744; 438/743
(58) Field of Search ................. 134/1.1, 1.2; 438/696, 438/695, 723, 724, 734, 743, 744

(56) References Cited

U.S. PATENT DOCUMENTS

| | | | |
|---|---|---|---|
| 5,286,344 | 2/1994 | Blalock et al. | 156/657 |
| 5,366,590 | 11/1994 | Kadomura | 156/662 |
| 5,611,888 | * 3/1997 | Bosch et al. | 156/643.1 |
| 5,691,246 | 11/1997 | Becker et al. | 437/225 |
| 5,783,496 | 7/1998 | Flanner et al. | 438/743 |
| 5,792,684 | * 8/1998 | Lee et al. | 438/238 |
| 5,817,579 | * 10/1998 | Ko et al. | 438/740 |
| 5,840,624 | * 11/1998 | Jang et al. | 438/624 |
| 5,843,847 | * 12/1998 | Pu et al. | 438/723 |
| 5,968,278 | * 10/1999 | Young et al. | 134/1.1 |
| 6,033,962 | * 3/2000 | Jeng et al. | 438/301 |

FOREIGN PATENT DOCUMENTS 6-283460 * 10/1994 (JP).

* cited by examiner

Primary Examiner—Gregory Mills
Assistant Examiner—George Goudreau
(74) Attorney, Agent, or Firm—George O. Saile; Stephen B. Ackerman

(57) ABSTRACT

The poor uniformity of Interlevel Dielectric Deposition (ILD) thickness for High Aspect Ratio (HAR) contact after Chemical Mechanical Planarization (CMP) will cause serious underlayer loss due to the longer over-etching time that is required to compensate for thickness differences within the wafer. Prior Art uses 1.5K Plasma Enhanced Tetra-Ethyl-Ortho-Silicate (PETEOS) to serve as a stop layer and thus reduce underlayer loss. The present invention teaches using a non-silicon oxide containing SiN/SiON or $Si_3N_4$/SiON as a stop layer. The present invention therefore is aimed at reducing underlayer loss and thereby improving the uniformity of the underlayer thickness upon completion of the hole etching process. Concurrently, the over-etch time can be reduced to less than 10% of the time required for Prior Art contact hole etching.

15 Claims, 2 Drawing Sheets

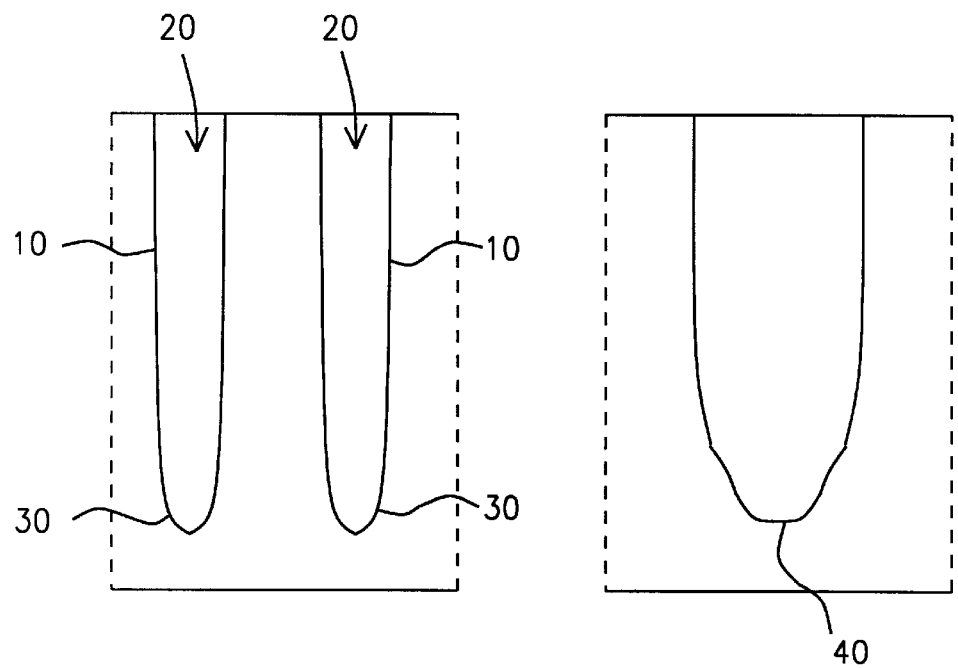
FIG. 1 – Prior Art
FIG. 2 – Prior Art
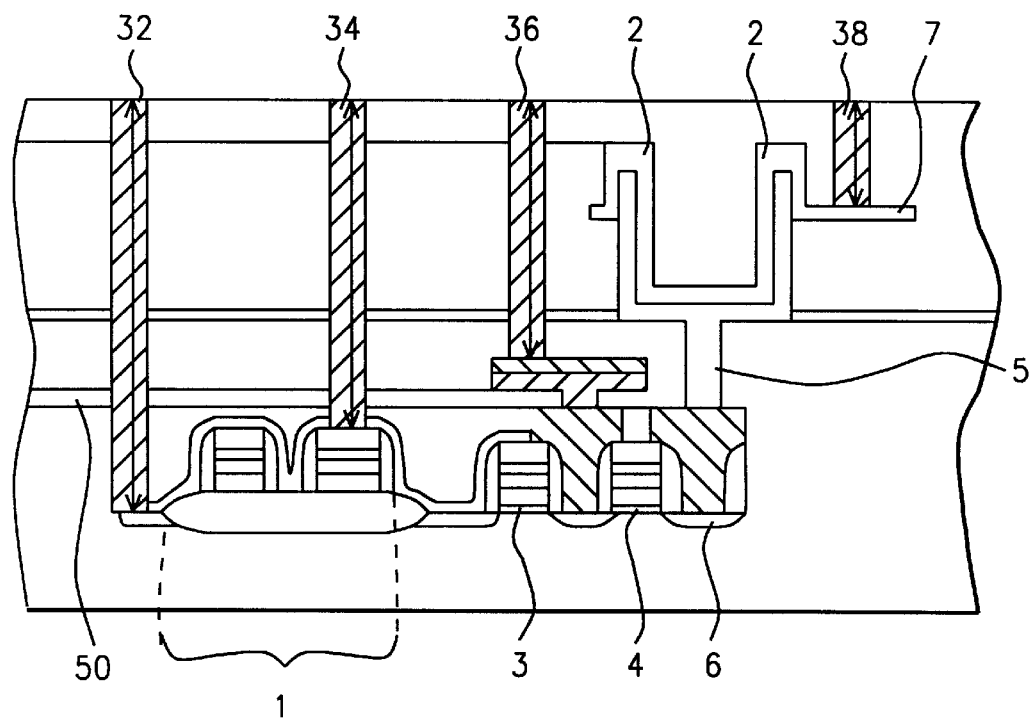
FIG. 3 – Prior Art

UNIFORMITY IMPROVEMENT OF HIGH ASPECT RATIO CONTACT BY STOP LAYER

FIELD OF THE INVENTION

The invention relates to the plasma etching of a silicon wafer in the manufacture of integrated circuits.

DESCRIPTION OF THE PRIOR ART

As the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions.

It is especially important to have a technology that can etch openings that have essentially vertical walls, most notably when the openings are to extend deeply into the surface layers. Special care must also be taken to insure that the profile of the lower section or bottom of the opening resembles a straight line in order to reduce thickness difference in the underlying layers. To this end, it is critically important to select a stop layer (that has a restraining influence on the etching process) within the semiconductor structure that enhances the linearity or straight-line profile of the bottom of the etched hole.

Additionally, to tolerate some misalignment in the masks used to define such openings, it is advantageous to provide protection to regions that need isolation but that inadvertently lie partially in the path of the projected opening. To this end it is sometimes the practice to surround such regions with a layer of material that resists etching by the process being used to form the openings. Accordingly, a technology that provides the desired results will need an appropriate choice both in the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

Basically, in plasma etching as used in the manufacturing of silicon integrated devices, a silicon wafer on whose surface various layers have been deposited is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

While elaborate theories have been developed to explain the plasma process, in practice most of such processes have been developed largely by experimentation involving trial and error of the otherwise relatively poor predictability of results.

Moreover, because of the number of variables involved and because most etching processes depend critically nor only on the particular materials to be etched bur also on the desired selectivity and anisotropy, such experimentation can be time consuming while success often depends on chance.

U.S. Pat. No. 5,783,496 (Flanner et al.) shows an etch process of a contact that stops on a $Si_3N_4$ layer on gates. Flanner details a special $C_xHyF_z$ containing gas 2 step process.

U.S. Pat. No. 5,286,344 (Bialock et al.) shows a process for a contact by etching $SiO_2$ and stopping on $Si_3N_4$.

U.S. Pat. No. 5,691,246 (Becker et al.) discloses an in-situ etch process of a contact through $SiO_2$ and $Si_3N_4$.

U.S. Pat. No. 5,366,590 (Kadomura) shows a $SiO_2$ and $Si_3N_4$ contact etch process.

SUMMARY OF THE INVENTION

It is the primary objective of the present invention to improve uniformity of the thickness of the stop layer at the bottom of etched holes after contact hole processing has been completed.

It is another objective of the present invention to considerably reduce presently required over-etch time when etching contact holes.

It is another objective of the present invention to reduce the integrated circuit Resistive Capacitive time constant.

It is another objective of the present invention to reduce integrated circuit junction leakage current.

It is another objective of the present invention to improve integrated circuit electrical performance.

It is another objective of the present invention to improve integrated circuit reliability.

FIG. 1 shows a cross section of Prior Art etched contact holes 20. These contact holes are created in a semiconductor-layered construction where the presently used Plasma Enhanced Tetra-Ethyl-Ortho-Silicate (PETEOS) is used as a stop layer. The stop layer serves the purpose of controlling or "slowing down" the etching of the contact hole and forms one of the layers within the semiconductor layered construction. As such the stop layer is deposited close to where the bottom 30 of the contact hole is designed to be without however being the last layer or bottom of the hole. The present profile of the contact openings has been obtained using the conventional etching sequence for 0.025 embedded DRAM circuits. Six gases are used for this etching sequence which resulted in poor underlayer selectivity. Special attention must also be paid to the contact opening profile. A poor contact opening profile results in poor contact barrier uniformity of the sidewalls 10 of the holes. FIG. 1 clearly shows the over-etching 30 that occurred in the underlying, typically TiSix, substrate.

FIG. 2 shows an enlargement of the lower section of a Prior Art contact hole. It is clear that section 40 of the bottom of the contact hole shows considerable bowing or hollowing out. In other words, the etching of the contact hole has not created a flat profile which means that the contact hole cuts into underlying layers. This is, from an electrical design point of view, a very undesirable profile. The bottom profile of the contact hole ideally is square and must not protrude into lower lying layers.

FIG. 3 shows Prior Art application of a layer 50 of PETEOS within a semiconductor structure. FIG. 3 demonstrates that the stop layer 50 of present design can be located close to the bottom of the etched contact hole without however forming the bottom of this hole, see holes 32 and 34. For holes 36 and 38 the stop layer 50 does not form part of the process of etching these holes. FIG. 3 is a cross section of a DRAM structure wherein 1 is a storage electrode of a memory cell, 2 forms a trench capacitor, 3 can be a bit line, 4 can be a word line, 5 can be a trench cell, 6 can be a trench plug and 7 can be a capacitor contact plate.

The poor uniformity of Interlevel Dielectric Deposition (ILD) thickness for High Aspect Ratio (HAR) contact after Chemical Mechanical Planarization (CMP) will cause serious underlayer loss due to the longer over-etching time that is required to compensate for thickness differences within the wafer. Prior Art uses 1.5K Plasma Enhanced Tetra-Ethyl-Ortho-Silicate (PETEOS) to serve as a stop layer and thus reduce underlayer loss. The present invention teaches using a non-silicon oxide containing $Si_3N_4$/SiON as a stop layer since non-silicon oxide assures uniformity of the thickness of the bottom layer of the contact hole after the contact hole has been etched into the semiconductor construct. This is due to the high selectivity of non-silicon oxide during contact hole processing. That is the Oxide, which is used during the contact hole etching process to form the contact hole, does not cause a depletion of the stop layer if non-silicon oxide is used as stop layer. The Prior Art use of 1.5K PETEOS for stop layer shows a considerable variation in the inter-level layer thickness after completion of the etching process, refer to FIGS. 1 and 2. The present invention therefore is aimed at reducing underlayer loss and thereby improving the uniformity of the underlayer thickness upon completion of the hole etching process. Concurrently, due to the high selectivity of oxide to non-silicon oxide, that is the etching oxide removes the non-silicon oxide at a slower rate than the presently used PETEOS, the overetch time can be reduced to less than 10% of the time used for contact hole etching using the Prior Art stop layer.

BRIEF DESCRIPTIONS OF THE DRAWINGS

FIG. 1 shows a cross section of Prior Art contact holes.

FIG. 2 shows an enlargement of a cross section of the lower section of a Prior Art contact hole.

FIG. 3 shows Prior Art application of a layer of silicon oxide within a semiconductor structure.

DETAILED DESCRIPTION OF THE PREFERRED EMBODIMENT

Figure 4:
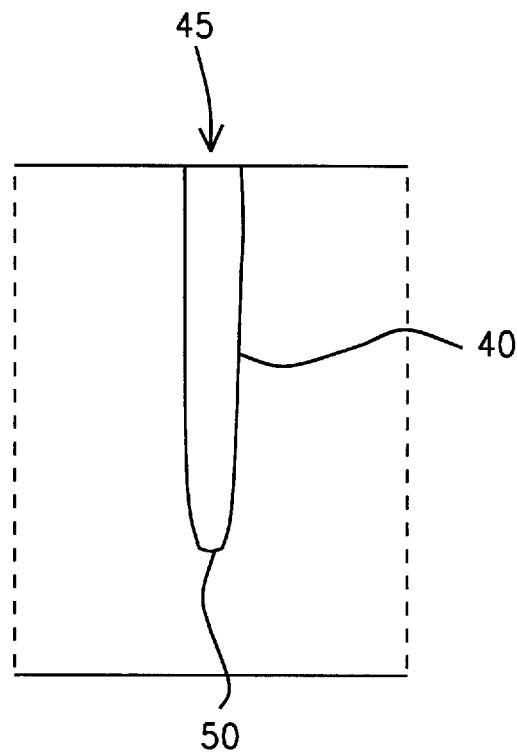
FIG. 4 shows a cross section of a contact hole formed within the context of the present invention.

According to the present invention, a semiconductor wafer etching process is provided whereby the bottom profile for holes or openings etched into the semiconductor wafer is improved. Some problems in achieving microscopic uniformity occur because etching rates and profiles depend on feature size and pattern density.

Microscopic uniformity problems can be grouped into two categories, that is aspect ratio dependent etching (ARDE) and pattern dependent etching. The cause of the problem is limited ion and neutral transport within the trench.

Aspect ratio dependent etching shows itself by creating sidewalls within the etched openings that are uneven and that have a profile with graded or non-linear walls. Trenches with a large aspect ratio will also etch more slowly than trenches with a small aspect ratio. Ion scattering results from ion-neutral collisions and electrical charging on the masks causes aspect ratio dependent etching. Some neutrals are transported to the bottom of the trench by diffusion, also contributing to the ARDE. Low gas pressure reduces the ARDE effect while chlorine-based chemistry shows less ARDE than fluorine-based chemistry during deep trench etching, this because ion assisted etching is dominant in chlorine-based chemistry.

This phenomenon became serious when the era of submicrometer etching began in recent years. Ion bombardment, electron bombardment, reactive neutral species, product desorption and re-deposition all appear to be important in determining the relative etch rates in trenches. The present invention prevents underlayer loss when combined with good stop layer selectivity. Underlayer loss will cause problems of junction leakage between the various layers within the semiconductor wafer.

Selectivity is defined as one film etching faster than another film under the same etching conditions. A higher etch rate ratio (ERR) between different layers is the crucial advantage of reactive ion etching over physical sputtering. The etch-rate differences between two different materials are due to different surface-etch mechanisms, such as adsorption, reaction, and desorption. During etching, the selectivities with respect to the masking material and the underlying layer require careful control. The required selectivity is defined according to a special percentage of overetch and film thickness.

Currently, the HAR contact etching for 0.25 $\mu$m. Embedded DRAM may result in a bow type contact profile and in poor underlayer selectivity. The bow type contact profile results in poor barrier metal uniformity while the underlayer loss causes junction leakage current. The present invention presumes an etching sequence using three gasses and is aimed at increasing the underlayer selectivity during the etching process. A three gas etching process however leads to sharply decreased etching or etching stop during the etching process. The present invention therefore provides for a sequence of three processing steps using multiple gas type etching. This sequence using three gasses for two of the three processing steps and lead to the indicated improved contact opening profile and the increased underlayer selectivity.

The results than of the provided etching process is improved contact profile within HAR contact etchings and a reduction of the leakage current between layers of the semiconductor wafer.

The three step processing sequence, which is assumed for the etching process of the contact holes is as follows.

Processing step 1, Main Etch 1 (ME1), this etch uses three gasses and has operating conditions of the plasma process chamber that are as follows:
Etching chamber pressure: 3–5 Milli Torr
Source or top plate power: 1100–1500 Watts
Bottom plate power: 1500–1900 Watts
Gas composition: 15–25 SCCM $CH_2F_2$ 25–35 SCCM $C_4F_8$ 150–250 SCCM CO.

Processing step 2, Main Etch 2 (ME2), this etching step is as follows:
Etching chamber pressure: 5–15 Milli Torr
Source or top plate power: 600–800 Watts
Bottom plate power: 800–900 Watts
Gas composition: 10–20 SCCM $C_2F_6$ 15–25 SCCM $CH_2F_2$ 35–45 SCCM CO 3–7 SCCM $C_4F_8$ 3–7 SCCM $O_2$ 75–125 SCCM Argon.

Processing step 3, Over Etch, this step is the same as the above indicated ME1 in both operating conditions applied to the plasma process chamber and in the gasses used for the etching, as follows:

Etching chamber pressure: 3–5 Milli Torr
Source or top plate power: 1100–1500 Watts
Bottom plate power: 1500–1900 Watts
Gas composition: 15–25 SCCM $CH_2F_2$ 25–35 SCCM $C_4F_8$ 150–250 SCCM CO.

Referring now specifically to FIG. 4, therein is shown a cross section 40 of a contact hole 45 after the hole has been etched using a non-silicon oxide to deposit the stop layer. It has already been highlighted, see FIG. 3, that the stop layer can occur at any level within a semiconductor structure although in general the stop layer will be located relatively close to the lowest or bottom level 50 of the contact holes that are to be formed in the semiconductor structure. In comparing the cross section shown in FIG. 4 with the cross section shown in FIG. 1 and by paying special attention to the lowest or bottom part of the contact hole, that is area 30 in FIG. 1 and area 50 in FIG. 4, it is apparent that section 50 in FIG. 4 closely approaches the previously indicated ideal cross section of a flat bottom of the hole that does not penetrate into lower levels.

Figure 5:
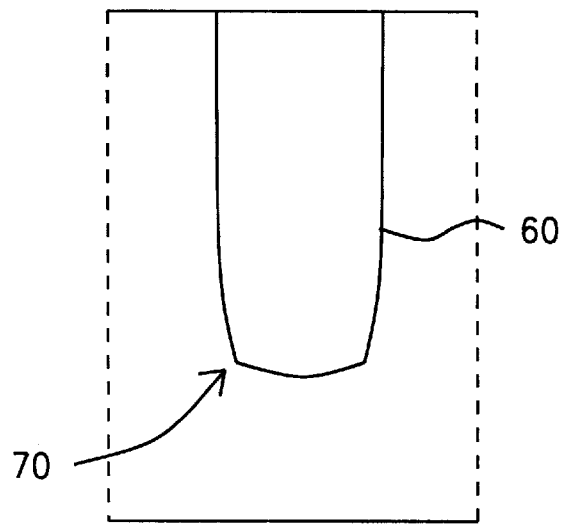
FIG. 5 shows a cross section of an enlargement of the lower section of a contact hole formed within the context of the present invention.

FIG. 5 shows a greatly magnified cross section 60 of the lower part 70 of the contact hole after contact hole etching where non-silicon oxide has been used for the deposition of the stop layer. It is even more apparent from this cross section that the lower part 70 of the contact hole approaches a straight line in profile, a phenomenon that is even more striking if the area 70 in FIG. 5 is compared with the area 40 of FIG. 2.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method for etching contact openings in a layered semiconductor wafer in a single reaction chamber thereby improving the contact profile of said etched contact openings, comprising the steps of:

providing a wafer, said wafer having been provided with overlying semiconductor layers comprising at least one of an etch stop layer, said at least one of an etch stop layer comprising non-silicon oxide $Si_3N_4$ or SiON;

positioning said wafer in a plasma reactor that includes a chamber within which there can be created a radio frequency discharge and wherein pressure can be adjusted, whereby further a gaseous medium can be discharged through the chamber, that when subjected to a radio frequency discharge generates a plasma that includes reactive ions, said chamber having a top plate and a bottom plate for supplying radio frequency power to said chamber;

performing a selective first main etch by flowing through said chamber a gaseous medium comprising between about 15 and 25 SCCM $CH_2F_2$ with between about 25 and 35 SCCM $C_4F_8$, with between about 150 and 250 SCCM CO while a radio frequency power of between about 1100 and 1500 Watts is applied to the top plate of the chamber, while a radio frequency power of between about 1500 and 1900 Watts is applied to the bottom plate of the chamber, under a pressure of about 5 mTorr, then;

performing a selective second main etch by flowing through said chamber a gaseous medium comprising between about 10 and 20 SCCM $C_2F_6$ with between about 15 and 25 SCCM $CH_2F_8$ with between about 35 and 45 SCCM CO with between about 3 and 7 SCCM $C_4F_8$ with between about 3 and 7 SCCM $O_2$ with between about 75 and 125 SCCM Argon while a radio frequency power of between about 600 and 800 Watts is applied to the top plate of the chamber, while a radio frequency power of between about 800 and 900 Watts is applied to the bottom plate of the chamber, under a pressure of between about 5 and 15 mTorr; and then performing a selective overetch by flowing through said chamber a gaseous medium comprising between about 15 and 25 SCCM $CH_2F_8$ with between about 25 and 35 SCCM $C_4F_8$ with between about 150 and 250 SCCM CO while a radio frequency power of between about 1100 and 1500 Watts is applied to the top plate of the chamber, while a radio frequency discharge of between about 1500 and 1900 Watts is applied to the bottom plate of the chamber, under a pressure of between about 5 and 15 mTorr.

2. The method of claim 1 wherein said selective first main etch, said selective second main etch and said selective overetch uses a low-pressure batch reactive ion etcher (RIE).

3. The method of claim 1 wherein said selective first main etch, said selective second main etch and said selective overetch uses a low-pressure, high-density electron cyclotron resonance (ECR) plasma etcher.

4. The method of claim 1 wherein said selective first main etch, said selective second main etch and said selective overetch uses a magnetically enhanced reactive ion etcher.

5. The method of claim 1 wherein said selective first main etch, said selective second main etch and said selective overetch uses a low-pressure, high-density plasma reactor.

6. The method of claim 1 wherein said selective first main etch, said selective second main etch and said selective overetch uses a transformer coupled plasma reactor.

7. The method of claim 1 wherein said selective first main etch, said selective second main etch and said selective overetch uses a low-pressure inductively coupled plasma reactor.

8. The method of claim 1 wherein said process of said selective first main etch, said selective second main etch and said selective overetch is an in-situ etch.

9. The claim as of 1 wherein the process of said selective first main etch, said selective second main etch and said selective overetch is an anisotropical etching process.

10. A method for etching contact openings in a layered semiconductor wafer in a single reaction chamber, thereby improving the contact profile of said etched contact openings, comprising the steps of:

providing a wafer, said wafer having been provided with overlying semiconductor layers comprising at least one of an etch stop layer, said at least one of an etch stop layer comprising non-silicon oxide $Si_3N_4$ or SiON;

positioning the wafer in a plasma reactor that includes a chamber within which there can be created a radio frequency discharge and wherein pressure can be adjusted, whereby further a gaseous medium can be discharged through the chamber, that when subjected to a radio frequency discharge generates a plasma that includes reactive ions, said chamber having a top plate and a bottom plate for supplying radio frequency power to said chamber; performing a selective first main etch by adjusting a first pressure level within the chamber to between about 3 and 7 mTorr;

adjusting a first power level applied to the top plate in the chamber to between about 1100 and 1500 Watts then;

adjusting a first power level applied to the bottom plate in the chamber to between about 1500 and 1900 Watts then; adjusting a first composition of a gaseous medium discharged through the chamber by providing between about 15 and 25 SCCM of $CH_2F_2$ with between about 25 and 35 SCCM of $C_4F_8$ with between about 150 and 250 SCCM of CO to the plasma chamber, thereby completing said selective first main etch, then;

performing a selective second main etch by adjusting a second pressure level within the chamber to between about 5 and 15 mTorr;

adjusting a second power level applied to the top plate in the chamber by applying between about 600 and 800 Watts to said top plate;

adjusting a second power level applied to the bottom plate in the chamber by applying between about 800 and 900 Watts to said bottom plate;

adjusting a second composition of a gaseous medium discharged through the chamber by providing between about 10 and 20 SCCM of $C_2F_6$ with between about 15 and 25 SCCM of $CH_2F_2$ with between about 35 and 45 SCCM of CO with between about 3 and 7 SCCM of $C_4F_8$ with between about 3 and 7 SCCM of $O_2$ with between about 75 and 125 SCCM of Argon to the plasma chamber for plasma formation, thereby completing said selective second main etch, then;

performing a selective overetch by adjusting a third pressure level within the chamber to between about 3 and 5 mTorr;

adjusting a third power level applied to the top plate in the chamber by applying between about 1100 and 1500 Watts to said top plate;

adjusting a third power level applied to the bottom plate in the chamber by applying between about 1500–1900 Watts to said bottom plate; and adjusting a third composition of a gaseous medium discharged through the chamber gas by providing between about 15 and 25 SCCM of $CH_2F_2$ with between about 25 and 35 SCCM of $C_4F_8$ with between about 150 and 250 SCCM of CO to the plasma chamber, thereby completing said selective overetch.

11. The method of claim 10 wherein said selective first main etch, said selective second main etch and said selective overetch use a low-pressure batch reactive ion etcher (RIE).

12. The method of claim 10 wherein said selective first main etch, said selective second main etch and said selective overetch use a low-pressure, high density electron cyclotron resonance (ECR) plasma etcher.

13. The method of claim 10 wherein said selective first main etch, said selective second main etch and said selective overetch use a magnetically enhanced reactive ion etcher.

14. The method of claim 10 wherein said selective first main etch, said selective second main etch and said selective overetch use a low-pressure, high-density plasma reactor.

15. The method of claim 10 wherein said selective first main etch, said selective second main etch and said selective overetch use a transformer coupled plasma reactor.

* * * * *